United States Patent [19]

Kubota et al.

[11] Patent Number: 4,734,386

[45] Date of Patent: Mar. 29, 1988

[54] BORON NITRIDE DOPANT SOURCE FOR DIFFUSION DOPING

[75] Inventors: Yoshihiro Kubota; Kenji Itoh, both of Gunma, Japan

[73] Assignee: Shin-Etsu Chemical Company, Ltd., Tokyo, Japan

[21] Appl. No.: 924,341

[22] Filed: Oct. 24, 1986

[30] Foreign Application Priority Data

Oct. 26, 1985 [JP] Japan ................................ 60-240215

[51] Int. Cl.$^4$ ......................................... H01L 21/385
[52] U.S. Cl. ..................................... 437/160; 148/33; 252/950; 437/169
[58] Field of Search .......................... 252/950; 148/33; 437/160, 161, 169, 168

[56] References Cited

U.S. PATENT DOCUMENTS

| | | | |
|---|---|---|---|
| 3,243,373 | 3/1966 | Reuschel | 252/950 |
| 3,540,926 | 11/1970 | Rairden, III | 148/DIG. 113 |
| 4,264,803 | 4/1981 | Shinko | 219/275 |
| 4,509,997 | 4/1985 | Cockayne et al. | 148/175 |
| 4,558,507 | 12/1985 | Okabayashi et al. | 29/571 |

*Primary Examiner*—Olik Chaudhuri
*Attorney, Agent, or Firm*—Wenderoth, Lind & Ponack

[57] ABSTRACT

A solid body formed by the chemical vapor-phase deposition of, for example, boron nitride is used as a solid dopant source for diffusion doping of semiconductor substrates in place of conventional sintered bodies of boron nitride. By virtue of the extremely low impurity content of the vapor-deposited dopant source in comparison with conventional sintered bodies, which unavoidably contain impurities originating in the powder of the dopant compound for sintering and the binder to facilitate sintering, the semiconductor substrate doped using the inventive dopant source has outstandingly low densities of lattice defects and dislocations in addition to the absence of troubles in the diffusion process due to melting of the binder contained in the sintered dopant sources.

1 Claim, No Drawings

BORON NITRIDE DOPANT SOURCE FOR DIFFUSION DOPING

BACKGROUND OF THE INVENTION

The present invention relates to a dopant source for diffusion doping of a semiconductor substrate or, more particularly, to a source of a p-type dopant for doping of a semiconductor substrate by the method of diffusion.

Several methods are known and practiced in the prior art for doping a semiconductor substrate with a dopant by the method of diffusion including: (a) the gas-diffusion method using a gaseous dopant as the diffusion source; (b) the ion plating method by bombarding the semiconductor substrate with ions of a dopant element under high vacuum; and (c) the solid-diffusion method using a sintered body of a metal oxide or metal nitride. The last mentioned solid-diffusion method is usually preferred to the first and second methods in respect of the advantages that high uniformity is obtained in the concentration of the dopant over the substrate surface, the apparatus used for the method is relatively simple and inexpensive, the method is suitable for mass production of semiconductor devices and the method can be performed without using any toxic or dangerous gas such as diborane.

The dopant source for the solid-diffusion method is usually in the form of a thin disc similar to semiconductor silicon wafers prepared by sintering a fine powder of the metal oxide or metal nitride. A problem in such a solid dopant source in the form of a sintered disc is that the sintered body is more or less unavoidably contaminated with various impurities or, in particular, metallic impurities originally contained in the powder of the metal oxide or nitride subjected to sintering and originating in the binder used to facilitate sintering when it is a metallic compound. When a semiconductor substrate of silicon or germanium is desired to be doped with a p-type dopant, for example, the most widely used solid dopant source is a sintered body of boron nitride while boron nitride powders used for sintering usually contain several kinds of impurities such as sodium phosphate, sodium oxide, iron oxide, calcium oxide and carbon as an unavoidable consequence of the method for the preparation of the boron nitride powder. Further, boron nitride powders are sintered usually with admixture of boric anhydride, calcium oxide, aluminum oxide, sodium oxide, aluminum phosphate or silicon dioxide as a binder to ficilitate sintering so that the sintered body of boron nitride always contains these binder materials remaining therein. The above mentioned impurities in the sintered boron nitride body as the solid dopant source originating in the boron nitride powder per se and the binder might cause no serious problems at least some years ago when the semiconductor substrates had small and thin dimensions and no extremely high performance was required for the doped semiconductor devices.

Along with the trend of requirements in recent years toward larger and larger diameters of the semiconductor substrates and higher and higher performace of semiconductor devices, however, the influences caused by the impurities in the solid dopant source are no longer negligible and, according to the inventors' knowledge obtained by the investigations, the above mentioned impurities in the solid dopant source of boron nitride have profound influences on the crystalline dislocations and lattice defects in the semiconductor substrates doped therewith.

SUMMARY OF THE INVENTION

Thus, an object of the present invention is to provide a solid dopant source for diffusion doping of a semiconductor substrate free from the problems and disadvantages in the conventional p-type solid dopant sources for diffusion doping prepared by the sintering method of a powdery dopant material in respect of the impurities unavoidably contained therein.

The p-type solid dopant source for diffusion doping of a semiconductor substrate according to the invention is a solid body of which at least the surface layer is formed by the vapor deposition of the p-type dopant compound.

DETAILED DESCRIPTION OF THE PREFERRED EMBODIMENTS

As is mentioned in the above given summary of the invention, the most characteristic feature of the inventive solid dopant source is that at least the surface layer of the solid body as the dopant source is formed by the method of vapor deposition of the dopant compound. The vapor deposition is usually performed by the CVD (chemical vapor deposition) method using a gas or a mixture of gases of high purity as the starting material and the vapor-deposited layer of the dopant compound can be formed, needless to say, without using any binder so that the solid dopant source is absolutely freed from various impurities unavoidable when the solid dopant source is prepared by the sintering techniques of the dopant compound in a powdery form.

The solid dopant source of the invention includes several kinds of p-type dopants without particular limitations. The compounds forming the p-type solid dopant source for diffusion doping are exemplified by the oxides and nitrides of the elements belonging to the IIIA Group of the Periodic Table including boron, aluminum, gallium and indium. These oxides or nitrides can be deposited in the CVD process by the reaction of a gasified halide of the dopant element, e.g. boron trichloride, aluminum chloride, gallium fluoride, indium fluoride and the like, with oxygen or water vapor for the oxides or nitrogen or ammonia for the nitrides.

The CVD method is not the only procedure for the vapor deposition of the dopant compound. For example, applicable methods for vapor deposition include physical and electrical methods such as vacuum vapor deposition, sputtering, ion plating and the like although these methods other than CVD are less preferable because an unduly long time is taken in order to obtain a sufficient thickness of the vapor-deposited dopant layer. On the contrary, the CVD method is advantageous in respect of the growing velocity of the vapor-deposited dopant layer to ensure high practical productivity of the process. When the desired dopant compound is boron nitride, in particular, the CVD method can be performed using boron trichloride and ammonia as the reactants which can be obtained each in a very high purity and with outstanding inexpensiveness to give a great economical advantage.

The solid dopant source for diffusion doping according to the invention is usually shaped in a disc-like form having a diameter approximately equal to that of the semiconductor substrate to be subjected to solid diffusion doping using the inventive solid dopant source. When the dopant compound is boron nitride, in particular, the disc-like solid dopant body is heated in an atmosphere containing oxygen or water vapor so as to have the surface oxidized thereby and the thus surface-oxidized dopant discs are held inside a diffusion tube made of quartz glass in an alternate face-to-face array with the semiconductor substrates keeping a small distance between the dopant discs and the adjacent semiconductor substrates followed by heating the diffusion tube at a temperature of about 700° to 1300° C. while a non-oxidizing gas such as nitrogen, argon and helium is passed through the tube.

The p-type solid dopant source for diffusion doping can give particularly satisfactory results when the dopant compound is boron nitride in comparison with conventional solid dopant sources of boron which may be a sintered body of boron nitride or boron oxide in respect of the unquestionably decreased impurity level which can be as low as only one hundredth to one millionth of the impurity level in conventional sintered bodies. Therefore, a great decrease is achieved in the crystalline dislocations and lattice defects of the semiconductor substrate ascribable to the metallic and carbonaceous impurities contained in the solid dopant source of boron nitride. The absence of any binder in the solid dopant source of the invention furthermore provides a solution of the troubles sometimes encountered in the conventional process of diffusion doping using a sintered solid dopant source such as thermal distortion or deformation of the dopant disc and adhesion of the dopant disc to the quartz glass-made boat supporting the semiconductor substrates and the dopant discs due to melting of the binder in the dopant discs.

In the following, examples are given to illustrate the inventive p-type solid dopant source for diffusion doping in more detail.

EXAMPLE 1

A gaseous mixture of a boron trichloride gas having a 6-nines purity and ammonia gas having a 5-nines purity was introduced into a vessel for chemical vapor deposition in which a high-purity graphite plate was held and heated at 2000° C. under a reduced pressure of 10 Torr to pyrolytically deposit boron nitride on the graphite surface. In this manner, 10 discs of pyrolytically vapor-deposited boron nitride were prepared each having a diameter of 100 mm and a thickness of 2 mm. The boron nitride discs contained metallic impurities in an amount not exceeding 10 ppm as a total. After surface oxidation at 1000° C. in an atmosphere of oxygen, the boron nitride discs were placed on and supported by a quartz glass-made boat alternately face-to-face together with semiconductor wafers each having a diameter of 100 mm and a thickness of 0.5 mm keeping a distance of 3 mm between the adjacent boron nitride disc and the silicon wafer. The boat supporting the boron nitride discs and silicon wafers was put into a quartz glass-made tube and heated for 30 minutes at 950° C. in an atmosphere of argon to effect doping of the silicon wafers with boron. The thus doped silicon wafers had a p-type sheet resistance of 60 ohm per square. The crystalline disorder in these silicon wafers was that the densities of lattice defects and dislocations per $cm^2$ were 0.1 and 2, respectively, on an average for the 10 silicon wafers.

For comparison, the same procedure of solid diffusion doping as above was performed using sintered boron nitride discs prepared using boron oxide as the binder. The results were that the doped silicon wafers had a sheet resistance of 150 ohm per square and the crystalline disorder was that the densities per $cm^2$ of lattice defects and dislocations were about 300 and 1000, respectively, on an average for 10 silicon wafers indicating that much better results could be obtained by using the solid dopant source according to the present invention.

When the conventional sintered boron nitride discs were used as the diffusion source, moreover, the discs were partly molten down on and adhered to the quartz glass-made boat to cause great difficulties in handling while no such troubles were caused when the vapor-deposited boron nitride discs according to the invention were used as the solid diffusion source. This great advantage obtained by use of the inventive diffusion source is presumably due to the absence of any binder material in the solid diffusion source.

EXAMPLE 2

Aluminum chloride of 5-nines purity was reacted with water vapor at 1200° C. to effect vapor deposition of aluminum oxide on a quartz glass plate to prepare 15 aluminum oxide sheets of 50 mm by 50 mm by 1.5 mm dimensions. These vapor-deposited aluminum oxide sheets were used as a solid diffusion source for p-type diffusion doping of 15 germanium substrates each having a diameter of 50 mm and a thickness of 0.3 mm at 1200° C. for 20 minutes in a similar manner to Example 1. The thus obtained p-type doped germanium substrates had a sheet resistance of 150 ohm per square and the densities per $cm^2$ of the lattice defects and dislocations in these germanium substrates were 0.5 and 5, respectively, on an average.

For comparison, the same process of diffusion doping as above was repeated using conventional sintered aluminum oxide sheets as the solid diffusion source. The results were that the densities of lattice defects and dislocations in the doped germanium substrates were 650 and 3200, respectively, per $cm^2$ on an average indicating the great advantage obtained by using the solid diffusion source according to the invention.

It was also noted that, although the vapor-deposited aluminum oxide sheets were found to adhere slightly to the quarts glass-made boat to cause some difficulties in handling as compared to the vapor-deposited boron nitride discs in Example 1, the difficulties in handling were well tolerable in comparison with the sintered aluminum oxide sheets.

What is claimed is:

1. In a method of doping a semiconductor substrate to impart p-type conductivity thereto by the solid diffusion method in which solid boron nitride as a p-type source and a semiconductor substrate are heated together in a container and the semiconductor substrate doped by the boron nitride, the improvement wherein the boron nitride is a solid body of which at least the surface layer is formed by the pyrolytic chemical deposition of boron nitride.

* * * * *